(12) United States Patent  
Biberger et al.

(10) Patent No.: US 12,300,459 B2
(45) Date of Patent: May 13, 2025

(54) METHOD FOR POSITIONING OBJECTS IN A PARTICLE BEAM MICROSCOPE WITH THE AID OF A FLEXIBLE PARTICLE BEAM BARRIER

(71) Applicant: Carl Zeiss Microscopy GmbH, Jena (DE)

(72) Inventors: Josef Biberger, Wildenberg (DE); Michal Postolski, Barlinek (PL); Miriam Tabea Kaefer, Aalen (DE); Holger Ehm, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 478 days.

(21) Appl. No.: 17/717,784

(22) Filed: Apr. 11, 2022

(65) Prior Publication Data

US 2022/0375714 A1    Nov. 24, 2022

(30) Foreign Application Priority Data

May 18, 2021    (DE) .......................... 102021205001.8

(51) Int. Cl.
*H01J 37/20* (2006.01)
*H01J 37/22* (2006.01)
(Continued)

(52) U.S. Cl.
CPC ............ *H01J 37/20* (2013.01); *H01J 37/222* (2013.01); *H01J 37/244* (2013.01); *H01J 37/28* (2013.01);
(Continued)

(58) Field of Classification Search
CPC ........ H01J 37/20; H01J 37/222; H01J 37/244; H01J 37/28; H01J 37/3045;
(Continued)

(56) References Cited

U.S. PATENT DOCUMENTS 4,687,931 A * 8/1987 Fukuhara ................ H01J 37/20
250/442.11
5,986,264 A * 11/1999 Grunewald ............. H01J 37/28
250/492.21
(Continued)

FOREIGN PATENT DOCUMENTS

DE    102006047729 A1    8/2007
DE    102010046902 B4    3/2012
EP       1812945 A2      8/2007

OTHER PUBLICATIONS

German Office Action, with translation thereof, for corresponding DE Appl 10 2021 205 001.8, dated Feb. 26, 2022.

*Primary Examiner* — David A Vanore
(74) *Attorney, Agent, or Firm* — Fish & Richardson P.C.

(57) ABSTRACT

A method for positioning a movable object in a sample chamber of a particle beam microscope is carried out with the aid of a flexible particle beam barrier. The particle beam microscope comprises at least one particle beam column for producing a beam of charged particles, and a sample chamber, a detector for detecting interaction signals and a control and evaluation unit. In the method, initially an object is provided in the sample chamber. Next, a barrier region is defined, which is subsequently scanned with the beam of charged particles. The interaction signals produced during the scan are detected. The object is moved towards the barrier region, wherein the detected interaction signals are monitored and signal changes are registered, with the result that it is possible to detect when the object moves into the barrier region or leaves the barrier region.

20 Claims, 6 Drawing Sheets

(51) Int. Cl.
*H01J 37/244* (2006.01)
*H01J 37/28* (2006.01)
*H01J 37/304* (2006.01)

(52) U.S. Cl.
CPC ..... *H01J 37/3045* (2013.01); *H01J 2237/204* (2013.01); *H01J 2237/2802* (2013.01); *H01J 2237/31749* (2013.01)

(58) Field of Classification Search
CPC ..... H01J 2237/2802; H01J 2237/20285; H01J 2237/208; H01J 37/304; H01J 2237/202; H01J 2237/28; G01N 23/2204; G01N 23/2251
See application file for complete search history.

(56) References Cited

U.S. PATENT DOCUMENTS

| | | | | |
|---|---|---|---|---|
| 6,521,890 | B2 * | 2/2003 | Ishitani | G01N 23/2255 |
| | | | | 850/43 |
| 6,812,462 | B1 * | 11/2004 | Toth | H01J 37/28 |
| | | | | 850/1 |
| 7,109,487 | B2 * | 9/2006 | Kienle | H01J 37/3056 |
| | | | | 250/311 |
| 7,208,724 | B2 * | 4/2007 | Moore | H01J 37/3056 |
| | | | | 324/754.1 |
| 7,414,252 | B2 * | 8/2008 | Moore | G01N 1/32 |
| | | | | 250/311 |
| 7,414,253 | B2 * | 8/2008 | Kleinschmidt | H05G 2/003 |
| | | | | 250/504 R |
| 8,487,270 | B2 * | 7/2013 | Zeile | H01J 37/20 |
| | | | | 250/311 |
| 9,601,313 | B2 * | 3/2017 | Brogden | H01J 37/31 |
| 10,088,401 | B2 * | 10/2018 | Uemoto | H01J 37/317 |
| 11,776,787 | B2 * | 10/2023 | Yagi | H01J 37/228 |
| | | | | 250/311 |
| 2008/0007725 | A1 * | 1/2008 | Togashi | G01N 21/9501 |
| | | | | 356/237.2 |
| 2010/0021378 | A1 * | 1/2010 | Rousso | A61B 6/4057 |
| | | | | 424/1.11 |
| 2011/0253893 | A1 * | 10/2011 | Banzhof | H01J 37/153 |
| | | | | 250/307 |
| 2012/0205538 | A1 * | 8/2012 | Schertel | H01J 37/3005 |
| | | | | 250/442.11 |
| 2012/0286159 | A1 * | 11/2012 | Donitz | H01J 37/28 |
| | | | | 250/309 |
| 2016/0035534 | A1 * | 2/2016 | Biberger | H01J 37/20 |
| | | | | 250/307 |
| 2019/0108970 | A1 * | 4/2019 | Kato | H01J 37/1472 |
| 2022/0216033 | A1 * | 7/2022 | Yagi | H01J 37/244 |

* cited by examiner

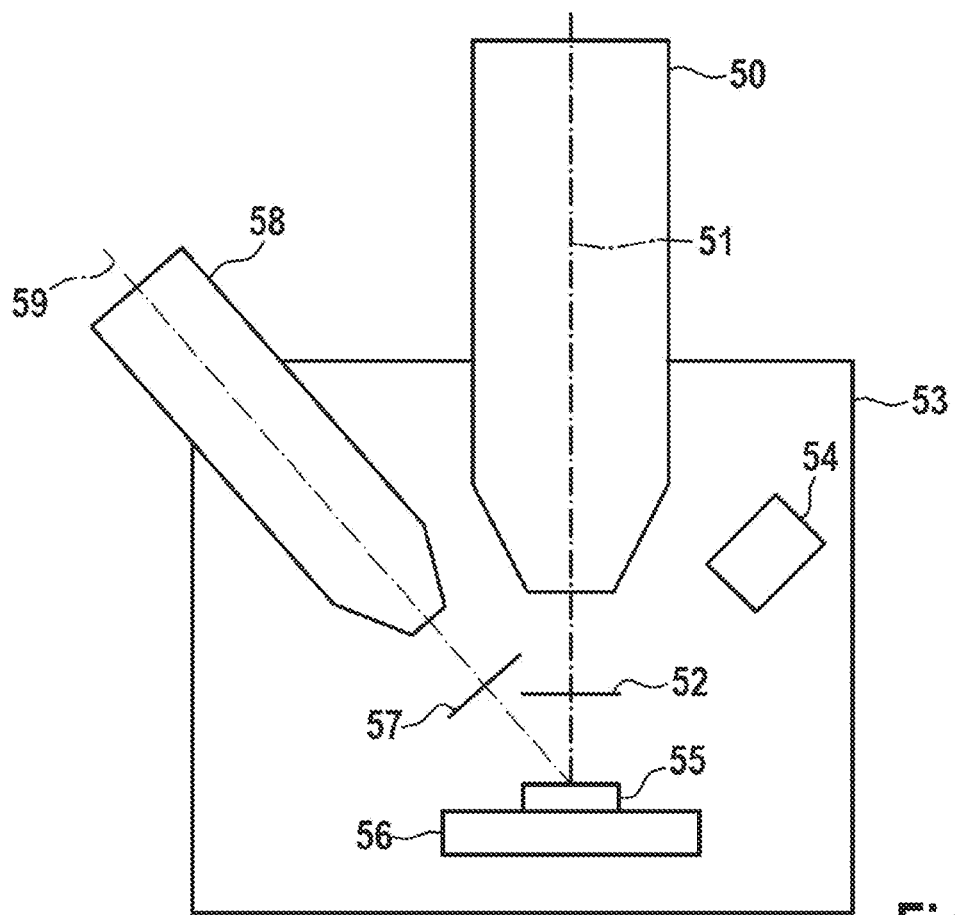
Fig. 5
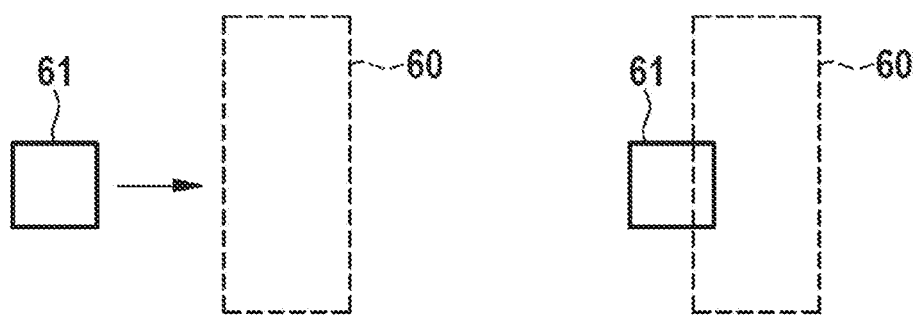
Fig. 6A                    Fig. 6B

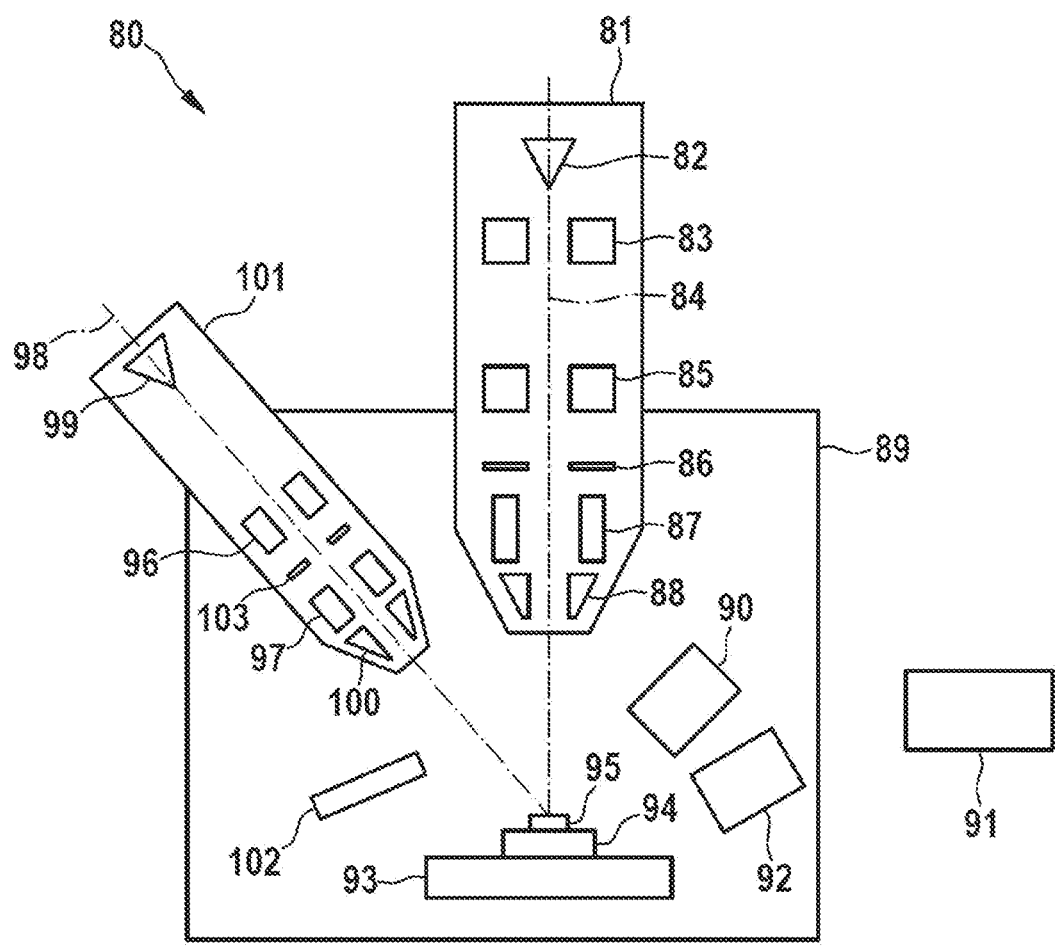
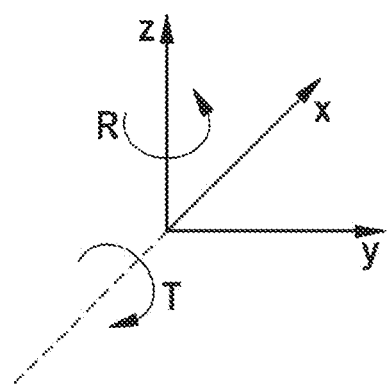
Fig. 8

METHOD FOR POSITIONING OBJECTS IN A PARTICLE BEAM MICROSCOPE WITH THE AID OF A FLEXIBLE PARTICLE BEAM BARRIER

CROSS-REFERENCE TO RELATED APPLICATION

This application claims benefit under 35 U.S.C. § 119 to German Application No. 10 2021 205 001.8, filed May 18, 2021. The contents of this application is hereby incorporated by reference in its entirety.

FIELD

The disclosure generally relates to a method for positioning objects in a particle beam microscope with the aid of a flexible particle beam barrier.

BACKGROUND

For examinations or sample processing carried out with a particle beam microscope, it is often desirable to move an object in the sample chamber in a controlled manner and to position it precisely. A particle beam microscope is understood to mean a microscope system operating with a beam of charged particles, such as a scanning electron microscope or an ion beam microscope.

The object can be, for example, an electron microscopic sample, such as a TEM lamella. A TEM lamella is typically prepared out of a sample block (original sample), is then separated from the sample block using lift-out and is held by a transfer apparatus, such as a micromanipulator.

Next, the extracted TEM lamella is usually transferred onto a suitable receptacle apparatus, for example onto a grid finger. In other words, the TEM lamella is usually moved in the sample chamber in a targeted, exact and controlled manner in three-dimensional space. The lift-out often involves the actual sample extraction (sample removal) and the transfer and attachment of the microsample to a target sample receptacle.

Such lift-out procedures have been automated in many ways in recent years. Of note is bringing the micromanipulator closer to the microsample to be prepared for the extraction and also bringing the microsample that is already attached to the micromanipulator closer to the target sample receptacle.

In order to control such bringing-closer procedures, image recognition methods have been proposed. To this end, a particle beam image can be recorded, which shows for example the TEM lamella, which is held by the manipulator, and the grid finger. The lift-out procedure can take place with visual monitoring by the user. A consideration here is that images are to be recorded, which generally takes a certain amount of time. In addition, the sample could be modified or damaged due to the irradiation during the image recording.

In addition, various further methods for automating TEM sample preparations are known.

However, typically it is not only microsamples that are positioned in the sample chamber. Frequently, displaceable detectors are used, which move to and fro between at least two positions, specifically a work position and a rest position. In addition, the sample stage of the particle beam microscope is also typically moved in at least three spatial directions to allow the recorded sample to be examined. For this purpose, special sample holders are typically mounted on a sample stage in order to receive the sample. There are a large number of sample holders that can be selected, depending on the specific application. A sample stage can thus carry structures of various designs, and there is a risk that the structures collide with other components in the sample chamber, such as for example the objective lens.

To avoid such collisions, it has been proposed to position a sample under the objective lens with the aid of a laser apparatus and to focus on it. A consideration here is that an additional laser apparatus is provided and positioning may involve only a very small spatial region.

Additionally known are light barrier systems, in which it is possible to detect with the aid of a light source and a light sensor when a movable obstacle interrupts the light beam. Light barriers can also be designed as light grids or light curtains.

It is furthermore known to electrically detect any contact of the sample stage with the objective lens (touch alarm) so that the movement of the stage can be stopped. It is a consideration here that the movement is stopped only when contact has been made.

The following documents are known:
U.S. Pat. No. 10,088,401 B2 (Uemoto et al.)
EP 1 812 945 B1 (Moore & Zaykova-Feldman)
U.S. Pat. No. 7,414,253 B2 (Moore et al.)
U.S. Pat. No. 7,208,724 B2 (Moore et al.)
U.S. Pat. No. 9,601,313 B2 (Brogden et al.)
DE 10 2006 047 729 A1 (Albiez)

SUMMARY

It would be desirable to be able to reliably monitor object movements or bringing-closer procedures in the sample chamber of a particle beam microscope without contact. It would be particularly advantageous if this could be accomplished with the apparatuses that are present as standard in a particle beam microscope.

The present disclosure proposes a method with which the position of a movable object in the sample chamber of a particle beam microscope can be determined. The present disclosure also proposes a related a computer program product.

Working with a particle beam microscope frequently involves exactly positioning an object in the sample chamber, in which vacuum conditions generally prevail during operation.

The object can be any article, for example a microscopic sample to be examined that is held on a sample stage. An object within the meaning of the present disclosure can, however, also be a displaceable detector, a sample stage, a sample holder mounted on the sample stage or any other desired component located in the sample chamber.

The "position" of the object is understood to mean the location and the spatial orientation of the object. Here, the word location means the localization of the object in three-dimensional space, which can be described by specifying the x-, y- and z-coordinates.

The spatial orientation is understood to mean the alignment of the object. The spatial orientation is usually specified in relation to the optical axes of the particle beam microscope.

In order to detect the position of the movable object without contact, the particle beam microscope is operated in a specific way. The mode of operation will be referred to below as "particle beam barrier", by analogy with the known light barrier. In contrast to a light barrier, however, it is not light but a beam of charged particles that is used in the "particle beam barrier" according to the disclosure. In addition, it is not the interruption of a beam that is detected, but a specific change in a detected, integrated signal, which occurs due to the interaction of the particle beam with the material of the object.

This is because the disclosure includes the finding that a defined solid-angle range can continuously or discretely be sampled with a particle beam, wherein signals are continuously detected. The temporal profile of the smoothed signals is captured with one or more detectors in a manner such that signal changes are detected. It is possible in this way to detect when an object, for example a microsample or a displaceable detector, is moved into the sampled solid-angle range or leaves the solid-angle range.

The method according to the disclosure does not operate based on the analysis of image data. Rather, the temporal profile of an averaged detector signal within a deliberately selected area or region is used to determine positions and to ascertain movement vectors.

For example, it is possible to detect when a moving object passes a threshold within the space.

In order to be able to detect the signal changes mentioned, a barrier region that is intended to be monitored within the sample chamber is designated. For designating the barrier region, the current position of the object should be known, for example by virtue of the fact that the spatial coordinates of the object are known. It is then also possible to take into account when defining the barrier region that the position of the object is known with a specific inaccuracy.

The barrier region is a solid-angle range which is designated by the user and through which a particle beam then passes continuously. It is particularly advantageous if the beam is a beam of charged particles, such as for example an electron beam or an ion beam. However, it is alternatively also conceivable that X-rays are used to scan the region.

In other words, the barrier region is one that is monitored with the aid of the particle beam barrier. Position (that is to say location and spatial orientation), size and shape of the barrier region are defined—depending on the planned application—over the course of the method according to the disclosure.

During the scanning of the barrier region with the primary particle beam, signals are detected with the aid of a suitable detector. Advantageously, a detector that is already present in the particle beam microscope used, for example a secondary electron (SE) detector and/or a backscattered electron (BSE) detector, is used for this purpose.

When the movable object is not yet inside the barrier region, a specific signal is detected. But as soon as the movable object enters the barrier region, a characteristic signal change can be detected.

In addition, it is also conceivable that a characteristic signal change can be observed when an object leaves a barrier region.

The position of the barrier region can be selected as desired. It is also conceivable for a plurality of barrier regions to be designated and monitored. If two particle beam columns are used, as is the case for example in an SEM-FIB combination microscope, it is also possible for a three-dimensional region to be monitored.

The position of the object can not only be detected with the aid of the method, but it can also be changed in a targeted manner. For this purpose, the position of the barrier region is iteratively changed and the object is in each case tracking it in a step-wise fashion.

The changes in the smoothed signal can be used not only to infer the location of the object. Rather, it is also conceivable to draw conclusions regarding the spatial orientation and/or the shape of the object.

The particle beam barrier according to the disclosure can be applied flexibly.

Location, spatial orientation, size and geometry of a barrier region can be freely selected and changed. In other words, the barrier regions can be freely defined. In addition it is conceivable that the method is repeated and the barrier region is newly defined in each case.

The design of the scanned area, that is to say of the sampled solid angle, offers further possible variations. For one, the shape and size can be varied. Various shapes are therefore possible, for example simple geometric shapes such as rectangles, circles and triangles, but also complex, multi-part polygons or even an L shape. It is also conceivable that the barrier region is designed as a straight or curved line or in the form of a point.

In addition, it is possible to vary beam and scanning parameters. For example, the focus, acceleration voltage, beam current, scanning speed or the scanning patterns used can be varied. Also conceivable are different repetition methods and averaging methods in the evaluation of the detected signals.

Moreover, differently defined barrier regions can be used in the temporal sequence of the method, and therefore monitoring can be designed in a flexible manner. The method can be performed with one barrier region or with a plurality of differently defined barrier regions.

In principle it is conceivable that the movement of the movable object with the method according to the disclosure is performed continuously or, alternatively, discretely, i.e. in a step-wise manner. Likewise, the monitoring using the particle beam barrier can be effected continuously or discretely.

For the purposes of documenting the positioning method, it is furthermore optionally possible to record visualization images at desired times, for example SEM images.

BRIEF DESCRIPTION OF THE DRAWINGS

Exemplary embodiments of the disclosure are explained below with reference to figures. For the purpose of explaining the components, therefore, reference is also made to the respectively preceding and succeeding description in its entirety.

FIG. 5 shows a second exemplary embodiment, in which the flexible particle barrier is used to monitor the positioning of a sample stage with structures.

FIGS. 6A-6B show a further exemplary embodiment, in which a sample for electron beam lithography is positioned.

FIG. 8 shows a FIB-SEM combination device, which is suitable for carrying out the method according to the disclosure.

EXEMPLARY EMBODIMENTS

Figure 1:
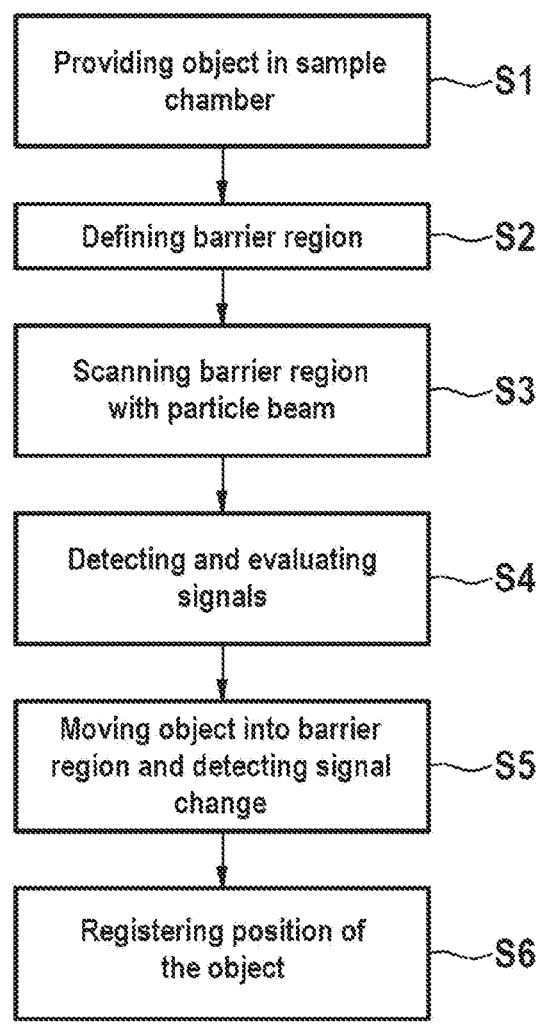
FIG. 1 shows the principle of the method according to the disclosure for positioning an object in the form of a flowchart.

FIG. 1 illustrates the fundamental sequence of the method according to the disclosure for positioning a movable object in a microscope system without contact. The method is carried out with the aid of a particle beam microscope, that is to say a scanning electron microscope, an ion beam microscope or a FIB-SEM combination microscope. The particle beam microscope comprises a sample chamber, in which vacuum conditions typically prevail during operation.

In a first step S1, a movable object to be positioned is provided in the sample chamber of the particle beam microscope.

The movable object can have various designs. For example, it may be an extracted TEM lamella, which is held by a micromanipulator and can be moved by moving the micromanipulator. However, the movable object can, for example, also be a displaceable detector, for example a displaceable STEM (scanning transmission electron microscopy) detector. The STEM detector can adopt a work position in the sample chamber and can be moved into a rest position during work pauses.

Both examples have in common that the movable object is intended to be positioned in the sample chamber. In the example of the displaceable STEM detector, care should be taken that the STEM detector is moved into a work position without colliding with other components in the sample chamber.

In step S2, a barrier region which will be scanned by the particle beam in the course of the method according to the disclosure is defined. The barrier region thus represents the barrier region of the particle beam barrier that is scanned in order to detect objects that enter into this region or leave this region.

For this purpose, location and spatial orientation of the barrier region are designated. This is accomplished in a manner such that—depending on the specific application—a defined volume region can be monitored. In this case, the barrier region should be advantageously localized between the current position of the movable object and the desired position of the object. In this way, it is ensured that the object during its movement in the direction of the desired position will pass through the barrier region or at least come in contact therewith and can be captured by the particle beam barrier.

The barrier region can be defined with the aid of the user interface of the particle beam microscope as a scanning area that is scanned by the particle beam.

It is also conceivable that the position of the barrier region is computed using the control software of the particle beam microscope or is determined on the basis of 3D models or CAD data. It is furthermore conceivable to generate an image of the components in the sample chamber closer to which for example the STEM detector is intended to be brought. It is then possible to designate the desired barrier region on the basis of the image.

The barrier region can thus be defined manually by the user or in automated fashion or have already been designated in advance. It is also conceivable that a plurality of barrier regions are designated in step S2.

When choosing the location, spatial orientation, size and geometry of the barrier region, it is advantageous if the movement speed of the object, the scanning speed and further scanning parameters are taken into account. It is also conceivable that the object is brought closer in a step-wise manner, wherein the pauses between steps can be used to evaluate the respectively obtained signal. In addition, the size of the object should be taken into account when designating the size of a barrier region.

The size of the barrier region can be selected depending on the speed with which the object (that is to say for example the movable STEM detector) is expected to be moved. At a low speed, the barrier region can be selected to be narrow; at a greater speed, by contrast, the barrier region should be selected to be wider.

When choosing this size and pose of the barrier region, the scanning speed and the integration time of the detector used should additionally be taken into account.

Then (step S3) the scanning starts, during which the barrier region is continuously or repeatedly scanned with a beam of charged particles. The particle beam used (primary particle beam), can be an electron beam or an ion beam. It is additionally conceivable that—depending on the specific application—different scanning parameters are varied, such as for example dwell time, pixel spacing, pixel size, line spacing or the scanning pattern.

Step S4 marks the start of the detection of interaction products with a suitable detector, which are produced when the particle beam is incident on material. That is to say that averaged signals of the detector are continuously recorded within the scanned region.

If there is no obstacle (that is to say no object) in the barrier region, a specific signal value is detected. The signals can be, for example, secondary electrons that are set free when the primary particle beam is incident on the chamber wall of the sample chamber or on other components of the microscope system. Such signals occur only to a lesser extent and should be considered to be noise.

However, as soon as the object to be positioned enters the barrier region (step S5), the object is illuminated with the particle beam. A clear signal change is then detectable. It is also conceivable that a signal change is detected when the object leaves the barrier region. It is thus possible in principle to ascertain on the basis of the signal profile both that the barrier region is being entered and that the barrier region is being left.

The detector signals in this case are location-independent. Rather, a temporal profile of an averaged detector signal is captured.

It has been proven to be particularly advantageous if the steps S3, S4 and S5 are carried out at the same time.

A suitable detector is one of a variety of detector types that can capture the respectively different interaction signals of the interaction between the primary particle beam and the illuminated material. For example, an in-lens detector or an SE (secondary electron) detector, which is arranged in the sample chamber, can be used. It is also conceivable to use a BSE detector to detect backscattered electrons (BSE: backscattered electrons).

It is just as possible to use an EDX detector that captures X-ray quanta. It is thus for example conceivable that an object having gold (Au) atoms can be detected very well using an EDX detector and be positioned using the method.

It may be particularly advantageous to use a plurality of detectors simultaneously or one after the other, because—depending on the properties of the movable object—different detector types can have different suitability.

Even shading effects with respect to the primary particle beam can be utilized in a targeted manner if the primary particle beam for example is directly incident on one of the detectors (or on the conversion surface of the detector).

If a clear signal change has been detected, the position of the moved object at this time is known. It is located at least partially within the barrier region. Consequently, the position of the object can be registered (step S6).

Figure 2:
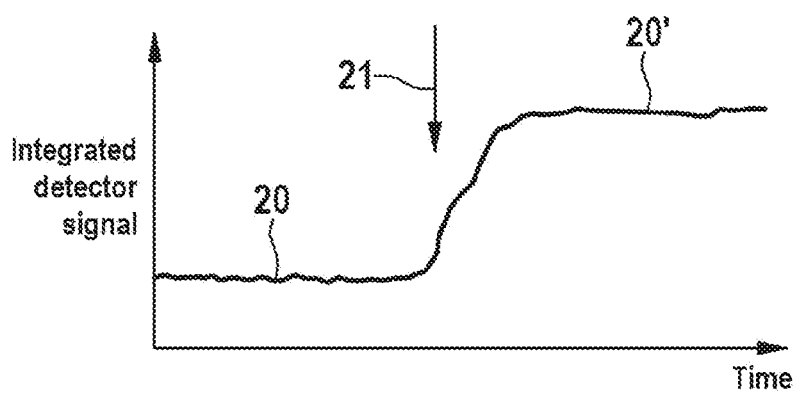
FIG. 2 shows, by way of example, the temporal profile of the signals detected for the particle beam barrier when an object is brought into the barrier region of the particle beam barrier.

FIG. 2 schematically shows an example of a time-dependent change in the detector signal during the scanning of the barrier region. The integrated detector signal (ordinate) is plotted over time (abscissa).

The curved 20, 20' represents the temporal profile of the detector signal. Initially, the movable object is not located in the barrier region, and the detector signal therefore has a first profile 20.

The detector signals captured can be averaged in various ways. For one, it is conceivable that an averaged greyscale value is formed for each scan run through the barrier region. In this case, one scan run leads to one signal value. Alternatively, a plurality of mean greyscale values can be computationally combined such that a scan run is incorporated into the signal value only to a fraction.

At a specific time 21, an object enters the scanned barrier region, and as a result the amplitude of the detector signal changes and the detector signal has a second profile 20'.

The signal profile shown, at which the signal increases when the object enters the barrier region, however, should be considered to be merely an example. It is just as conceivable that the signal drops or it increases when a first detector is used and drops when a second detector is used.

At any rate, the profile of the detected signal is monitored. In other words: the signal is analysed to reliably detect and register any significant signal changes. For this purpose, different suitable methods can be used, such as smoothing or derivation.

It can be assumed that each object that enters the barrier region produces a typical temporal signal profile, that is to say it has a typical signature.

If the system used is known, a typical signature can be detected when the object passes through the barrier region.

The signature can be dependent on various parameters, for example on the movement speed of the object, on the size and shape of the barrier region, and on the detector used. In particular, the selected detector settings play a role, for example the setting of brightness and contrast.

It is also conceivable to use a plurality of detectors for signal detection at the same time, and then the relevant signature is captured in different detector systems at the same time.

FIGS. 3A-3D schematically show a first, specific exemplary embodiment of the method, with which an extracted TEM lamella can be positioned.

A TEM lamella is understood to mean an electron-microscopic sample which has substantially the shape of a flat cuboid. At least in one region the sample cuboid has to be thin enough that electrons can radiate through it. Electrons that have passed through the TEM lamella (known as transmitted electrons) can then be detected via a suitable detector and used to generate an image of the sample (known as transmission image or a diffraction image).

To prepare a TEM lamella, initially a lamella is extracted from an original sample and is separated from the original sample by way of lift-out. For the purposes of further processing and examination, the TEM lamella is then intended to be transferred to a grid finger, that is to say to a sample receptacle apparatus.

The extracted TEM lamella 32, which is held by a micromanipulator 31, is then brought closer to a grid finger 35 with the aid of the particle beam barrier according to the disclosure so that the TEM lamella 32 can be fixed to the grid finger 35 in a later step.

Figure 3A:
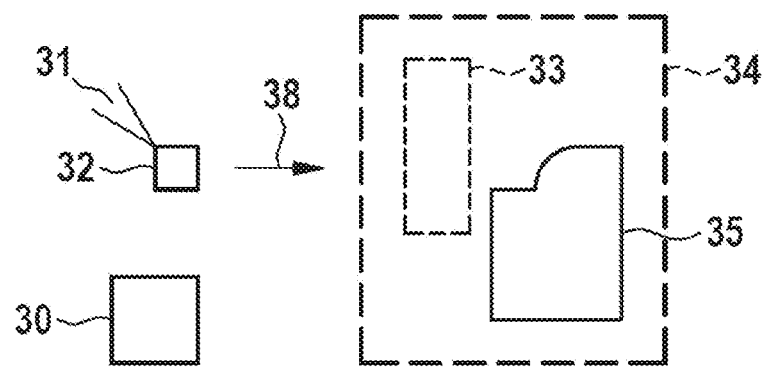
FIGS. 3A-3D show schematically a first exemplary embodiment of the method, in which an extracted TEM lamella held by a micromanipulator is brought closer to a grid finger with the aid of the particle beam barrier.
Figure 3B:
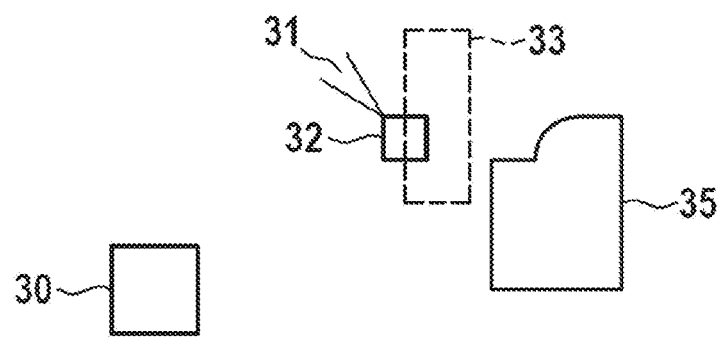
Figure 3C:
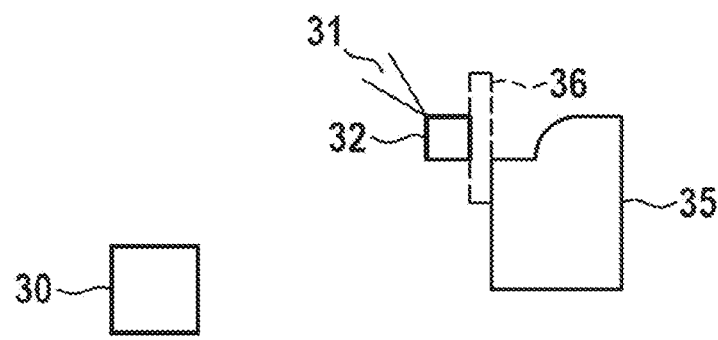

Initially, a grid finger 35 is provided in the sample chamber of a particle beam device (FIG. 3A). A first barrier region 33 is positioned in the vicinity of the grid finger 35. The first barrier region 33 is located between the current position of the TEM lamella 32 and the grid finger 35. In order to be able to define the first barrier region 33, an image that encompasses an imaged region 34 can be recorded. However, such an image recording is not mandatory.

The first barrier region 33 is then scanned with a beam of charged particles. The signals that are produced in the process, for example secondary electrons (SE) and/or back-scattered electrons (BSE), are detected in a location-independent manner with a suitable detector 30.

The TEM lamella 32 is then moved in a first movement direction 38, which is indicated by the arrow 38, in the direction of the grid finger 35, and thus also in the direction of the first barrier region 33. The first movement 38 can take place in the horizontal direction, for example.

When the TEM lamella 32 enters the first barrier region 33 (FIG. 3B), a clearly detectable signal change occurs. It is particularly advantageous if the movement of the TEM lamella 32 is stopped immediately when the signal change is detected. The position of the TEM lamella 32 is then known, since at least part of the TEM lamella is located within the region of the barrier 33.

Then, a second barrier region 36 is defined (FIG. 3C), which lies closer to the grid finger 35 than the first barrier region 33 in order to bring the TEM lamella 32 even closer to the grid finger 35. It is assumed in this case that the TEM lamella 32 continues to be moved towards the grid finger 35.

Then, once again the signal change that occurs when the TEM lamella 32 enters the second barrier region 36, as described above, is detected.

Figure 3D:
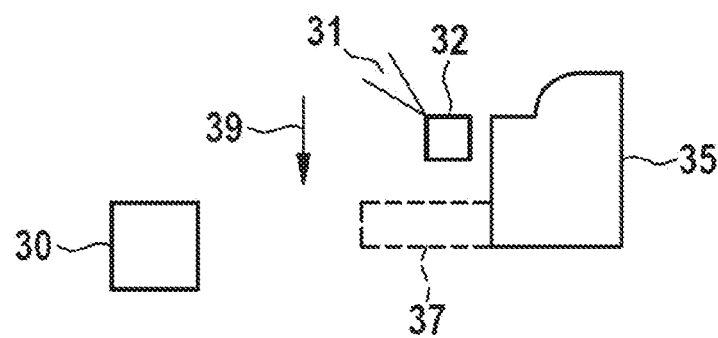

It is furthermore conceivable that the movement of the TEM lamella 32 takes place in a second movement direction 39 and, accordingly, a third barrier region 37 is designated, as shown in FIG. 3D. In the illustration of FIGS. 3A-3D, the second movement direction 39 is a vertical movement, for example.

Moreover, it is conceivable that the different barrier regions are designated in advance. Here, the movement direction of the object (that is to say of the TEM lamella) is taken into account in each case.

Figure 4:
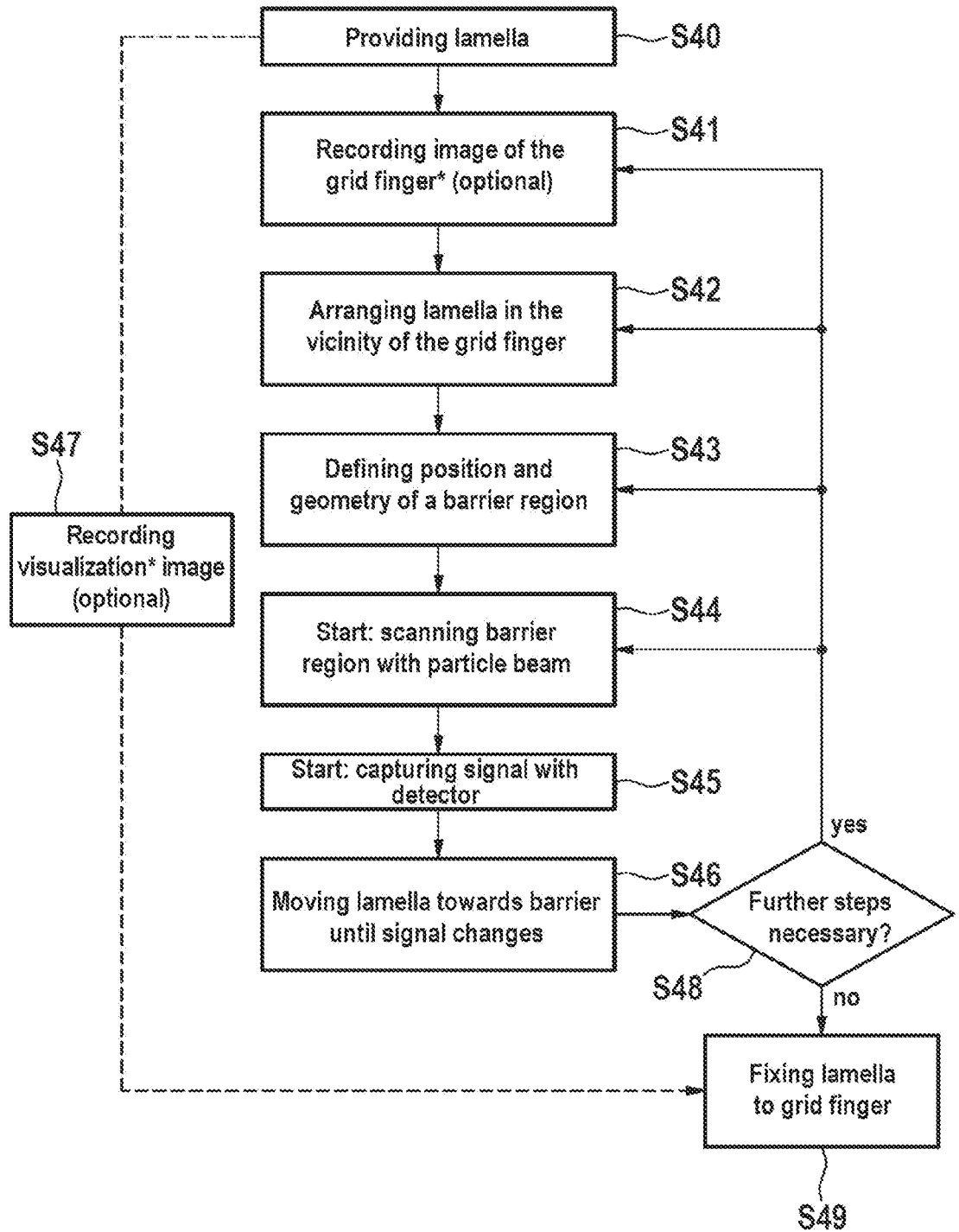
FIG. 4 shows the flowchart of the first exemplary embodiment of the method.

FIG. 4 shows the first exemplary embodiment as a flowchart.

Initially, a TEM lamella is provided in the sample chamber of the particle beam microscope in step S40. The TEM lamella has already been extracted from the original sample and is held by the needle tip of a micromanipulator. Alternatively, a different transfer apparatus can be used, for example a nano-gripper. The transfer apparatus should be designed such that the lamella being held can be moved in a targeted manner.

An image of the grid finger and its surroundings can then optionally be recorded (step S41). It is here not necessary to image the TEM lamella. Rather, the point is to designate the position of the barrier region in the vicinity of the grid finger.

Step S41 can also be omitted if instead the desired position can be defined in a different way (step S43), for example by computation or on the basis of already existing CAD data.

The TEM lamella is then arranged in the vicinity of the grid finger in the sample chamber by way of moving the micromanipulator (step S42).

In step S43, the position, size and geometry of a first barrier region are designated.

Next, scanning the barrier region with a beam of charged particles is started (step S44).

From step S45, the signals are detected with a suitable detector. The captured signals can be analysed using different suitable averaging methods. For example, temporal averaging is conceivable, but also the computational combination of a plurality of scans, wherein a scan is considered to encompass a single scan of a barrier region.

The TEM lamella is then moved towards the barrier region (step S46). At the same time, the barrier region is scanned (i.e. sampled continuously or intermittently) and analysed. As soon as the TEM lamella enters the barrier region, the detected signal changes. The changes in the signal are monitored, with the result that this signal change is registered. When a signal change is detected, the movement of the TEM lamella can be stopped so that the exact position of the TEM lamella, specifically at the edge of the barrier region, is known. Alternatively, the movement of the TEM lamella can be changed when a signal change is detected.

In step S48, an interrogation as to whether further positioning steps are desired is performed. If this is the case (S48 interrogation: yes), steps S42 to S46 can be repeated in order to bring the TEM lamella even closer to the grid finger. If no further steps are desired (S48 interrogation: no), the TEM lamella can be fixed to the grid finger in the subsequent step S49. It is thus conceivable that some or all of the mentioned steps of the described method can be repeated until the object has been positioned as desired. In particular, it has been proven to be advantageous to repeat steps S44 (scanning), S45 (detecting the signal), S46 (moving the lamella), S47 (monitoring the detected signal).

Optionally, in an additional step S47, which is carried out parallel to the steps S40 to S48, a visualization image can be recorded. The latter can be an SEM image, for example. A visualization image is generated independently of the rest of the positioning method and merely serves for the observation and documentation of the process. That is to say, such a visualization image can be recorded at every stage of the method in order to make it possible for the user to visually track the progress of the method.

The exemplary embodiment shown in FIGS. 3A-3D and 4 is not limited to the use of a grid finger for receiving a microsample. Rather, receptacle apparatuses of different types, such as for example an in-situ STEM holder or a special holder for APT (atom probe tomography) analyses, can also be used.

It is additionally conceivable that the method is used in a modified form to transfer a TEM lamella from an original sample to a transfer apparatus (what is known as lift-out). That is because even in this case, a movable object—in this case the transfer apparatus—is positioned (that is to say brought closer to the lamella). The transfer apparatus can be, for example, a micromanipulator, a nano-gripper or the like.

It is also conceivable that the method described in FIGS. 3A-3D and 4 is modified such that the grid finger itself is moved and is brought closer to the TEM lamella with the aid of the particle beam barrier described. Furthermore, the method can also be used to bring two movable objects closer to each other.

The method according to the disclosure can also be used to position or bring closer any desired object in the sample chamber of a particle microscope. The object can be a microsample (for example a TEM lamella, APT (atom probe tomography) sample, lithography sample), a receptacle apparatus (e.g. a grid finger, manipulator needle, nano-gripper) for receiving a sample, a displaceable detector or another movable object.

Accordingly, FIG. 5 shows a second exemplary embodiment of the method, in which the flexible particle beam barrier is used to monitor the positioning of a sample stage with structures.

The schematic illustration shows the arrangement in the sample chamber 53 of a FIB-SEM combination device. The FIB-SEM combination device comprises an electron beam column 50 having a first optical axis 51, and an ion beam column 58 having a second optical axis 59. Located in the sample chamber 53 is a displaceable sample stage 56, which can accommodate a sample holder 55 for holding a sample. Many types of sample holders 55 are known, and as a result various sample holder structures can be mounted on the sample stage 56.

In order to minimize the risk of a collision between the sample stage 56 or sample holder 55 with a structural component of the microscope, such as for example the electron beam column 50, ion beam column 58 or a detector 54, barrier regions 52, 57 are defined.

For example, it is conceivable to define a first barrier region 52 in the vicinity of the objective lens of the electron beam column 50. A second barrier region 57 can be positioned in the vicinity of the objective lens of the ion beam column 58. When the sample stage 56 or one of its structures enters one of the barrier regions 52, 57, the stage movement can be immediately stopped. Consequently, the particle beam barrier according to the disclosure can be used as protection against collision.

A further exemplary embodiment is illustrated schematically in FIGS. 6A-6B. The latter shows the exact positioning of the sample 61 for electron beam lithography.

Typically, samples 61 for electron beam lithography are coated with an electron beam resist that reacts to particle irradiation.

Using the particle beam barrier according to the disclosure, it is possible to ascertain when a lithography sample 61 comes into contact with a previously defined region 60. As described above, initially a barrier region 60 is designated (FIG. 6A).

When the edge of the lithography sample 61 enters the barrier region 60 (FIG. 6B), the movement of the lithography sample 61 can be stopped. In this way, only one edge of the lithography sample 61 is irradiated by the particle beam and undesired irradiation effects are thus avoided. The radiation dose that is incident on structures of the lithography sample 61 can therefore be kept low.

It is furthermore also conceivable that the particle beam barrier according to the disclosure is used to bring two movable objects closer to each other, for example to bring a grid finger, which is moved with the aid of a sample stage, closer to a manipulator (having a limited range).

FIGS. 7A-7D show how the particle beam barrier according to the disclosure can be used to move an object 70 in space in a targeted manner by iteratively displacing the barrier region 72.

By step-wise displacement and changing the geometry of a barrier region 72 (or of a plurality of barrier regions), a plurality of spatial directions can be monitored. It is also conceivable to track a path.

Figure 7A:
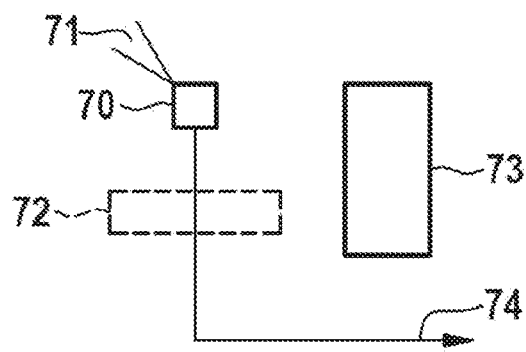
FIGS. 7A-7D show how an object can be moved in space in a targeted manner by iteratively displacing the barrier region.
Figure 7B:
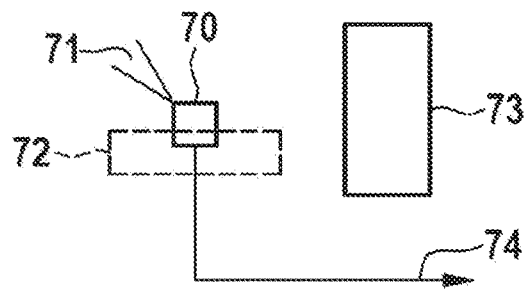
Figure 7C:
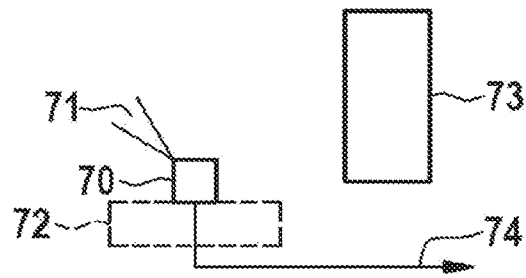
Figure 7D:
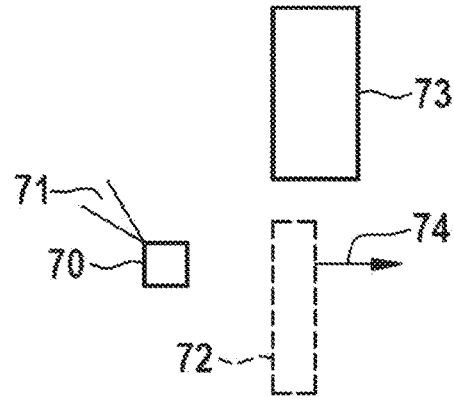

For this purpose, the barrier region 72 of the particle beam barrier is adapted iteratively along a desired path 74 (FIG. 7A to FIG. 7B). It is then possible for example to use successive displacement and/or adaptation of the barrier region 72 to scan specific spatial regions. The movable object 70 is tracked in each case and thus moved in space along the path 74. This is for example how an obstacle 73 can be handled (FIG. 7D). This is based on the fact that it is possible to register when an object enters a barrier region or leaves the barrier region. Once such a movement has been registered, the barrier region can be displaced and/or changed.

It is thus possible using the method according to the disclosure to monitor the movement of an object in two spatial directions that are aligned, for example, orthogonally with respect to one another, and as a result the vertical and the horizontal movement of the object are monitorable. For this purpose, a first barrier region is defined, with which the movement of the object in a first spatial direction can be detected (FIG. 7A to FIG. 7C). In addition, a second barrier region is defined, with which the movement of the object in a second spatial direction is detected (FIG. 7D).

In addition, this form of the method can be used to position the object with increasing accuracy.

It is furthermore conceivable that a plurality of differently shaped barrier regions be used iteratively in this manner. In this case, the barrier regions can of course also have different sizes.

The method according to the disclosure can also be used to monitor and position a movable object in the three spatial dimensions. For this purpose, two particle beams are involved, which are not aligned parallel to each other. Both particle beams are used here to scan the barrier regions.

This embodiment of the method can be performed for example in an L-shape FIB-SEM combination device. In a particular form of a two-beam device, the ion beam column and the electron beam column are arranged at right angles (90°) to each other, and therefore the two optical axes are arranged in the shape of an L.

The optical axis of the electron beam column is here aligned parallel to the z-axis, with the result that the position of an object on the z-axis cannot be detected with the aid of the electron beam column. Only positions along the x-axis and y-axis can be detected by the electron beam column.

In addition, positions along the z-axis and the x-axis can certainly be imaged using the ion beam column, whose optical axis runs parallel to the y-axis, since the ion beam column is aligned perpendicular to the z-axis.

By scanning a barrier region with both particle beams in such alignments, it is possible to observe an object in space, that is to say in all three spatial directions x, y and z. It is conceivable here that in each case only part of the barrier region is scanned by a particle beam. The arrangement of objects in three-dimensional space is thus derivable, and as a result objects can be positioned in three-dimensional space with the aid of the particle beam barrier according to the disclosure.

However, this embodiment is not restricted to an L-shape two-beam device. Rather, it is also conceivable that the two particle beam columns are arranged at a different, non-zero angle, for example 56°, 52° or 48°, to each other.

It is furthermore conceivable that a barrier region has a separated geometry. This is understood to mean that the barrier region has different partial regions that are not contiguous and are arranged at a distance from one another. However, the partial regions are considered to be a single region in the signal evaluation and are evaluated as a single region. That means that the detected signal of these partial regions is evaluated as one data point per scan.

In addition, two separated barrier regions that are arranged at a distance from each other can be scanned and detected more or less simultaneously and independently of one another, wherein signals of these regions are analysed separately from one another. This gives two separate data points for these barrier regions. Both barrier regions can thus be observed and monitored in parallel.

FIG. 8 shows with the example of a FIB-SEM combination device 80 a particle beam microscope that can be used to carry out the method according to the disclosure.

In order to make available a sample 95 to be examined for microscopic examination or processing, the sample 95 is held by a sample holder 94, which is mounted on a sample stage 93 of the FIB-SEM combination device 80. In addition, the FIB-SEM combination device 80 can comprise further holding apparatuses, such as a grid finger. Alternatively, the sample 95 can be held by a transfer apparatus 102, for example a micromanipulator or a nano-gripper.

The sample stage 93 is arranged in the sample chamber 89 of the FIB-SEM combination device 80, where vacuum conditions prevail during operation.

It is particularly advantageous if the sample stage 93 is designed as a multi-axis sample stage, as a result of which a plurality of translational and rotational degrees of freedom of movement are made available. This is the case, for example, if the sample stage 93 is embodied as a five-axis stage comprising the translational axes x, y and z and the rotation axes R and T (tilt axis). In this case, the translation axes mentioned are aligned in each case perpendicularly to one another. The rotation axis R is usually aligned parallel to the z-axis, while the tilt axis T is generally arranged perpendicular to the rotation axis R. The sample 95 can thus be moved in the three spatial directions x, y and z by a multi-axis stage in order to change the location of the sample 95.

The FIB-SEM combination device 80 comprises two particle beam columns, specifically an electron beam column 81 for producing an electron beam and an ion beam column 101 for producing an ion beam. Both particle beams are directed at the sample 95, which advantageously is situated at the coincidence point of both particle beams.

During the operation of the FIB-SEM combination advice 80, primary electrons are generated in an electron source 82, the primary electrons being focused, parallelized or scattered along the optical axis 84 of the electron beam column 81 by the condenser lens systems 83, 85 and trimmed by at least one aperture stop 86. In addition, the electron beam column 81 comprises a deflection system 87, which enables the primary electron beam to be guided over the sample 95 in raster-type fashion, and also an objective lens 88, with the aid of which the primary electron beam can be focused onto the sample 95.

The FIB-SEM combination device 80 moreover comprises an ion beam column 101 with an ion source 99, a deflection system 97, an aperture stop 103 and lens element systems 96 and 100. The ion source 99 can be a liquid metal ion source (LMIS), for example, which is operated with a gallium ion source, for example.

The ions generated in the ion source 99 are accelerated along the optical axis 98 of the ion beam column 101, bundled and focused at the sample 95 via an objective lens system 100. The ions incident on the sample 95 can be used to remove material of the sample 95 and/or to image the sample 95. Optionally, the FIB-SEM combination device 80 can also have a gas injection system 92 for introducing process gases, as a result of which removing material and/or depositing material is made possible.

Furthermore, the FIB-SEM combination device 80 comprises at least one detector 90 for detecting interaction products of the interaction of the electrons and/or ions with material of the sample 95. By way of example, the detector can be an SE detector or a BSE detector.

In addition, the FIB-SEM combination device 80 comprises an evaluation and control unit 91. The evaluation and control unit 91 can execute control commands comprised in a computer program product sequentially and/or in parallel. The execution of the control commands causes the FIB-SEM combination device 80 to implement an embodiment of the method according to the disclosure.

LIST OF REFERENCE SIGNS

S1 Providing object in sample chamber
S2 Defining barrier region
S3 Scanning barrier region with particle beam
S4 Detecting and evaluating signals
S5 Moving object into barrier region and detecting signal change
S6 Registering position of the object
20 First profile of the detector signal
20' Second profile of the detector signal
21 Time an object enters the barrier region
30 Detector
31 Micromanipulator
32 TEM lamella
33 First barrier region
34 Imaged region
35 Grid finger
36 Second barrier region
37 Third barrier region
38 First movement direction
39 Second movement direction
S40 Providing lamella
S41 Recording image of the grid finger (optional)
S42 Arranging lamella in the vicinity of the grid finger
S43 Defining position and geometry of a barrier region
S44 Starting scan of the barrier region with particle beam
S45 Start: capturing signals with detector
S46 Moving lamella towards barrier until signal changes
S47 Recording visualization image (optional)
S48 interrogation: Further steps desired?
S49 Fixing lamella to grid finger
50 Electron beam column
51 Optical axis of the electron beam column
52 First barrier region
53 Sample chamber
54 Detector
55 Sample holder
56 Sample stage
57 Second barrier region
58 Ion beam column
59 Optical axis of the ion beam column
60 Barrier region
61 Lithography sample
70 Object
71 Micromanipulator
72 Barrier region
73 Obstacle
74 Path
80 FIB-SEM combination device
81 Electron beam column
82 Electron source
83 First condenser lens system
84 Optical axis of the electron beam column
85 Second condenser lens system
86 Aperture stop
87 Deflection system
88 Objective lens system (SEM)
89 Sample chamber
90 Detector
91 Evaluation and control unit
92 Gas injection system
93 Sample stage
94 Sample holder
95 Sample
96 Lens system
97 Deflection system
98 Optical axis of the ion beam column
99 Ion source
100 Objective lens system (FIB)
101 Ion beam column
102 Transfer apparatus (e.g. micromanipulator)
103 Aperture stop
x x-axis
Y y-axis
Z z-axis
R Rotation axis
T Tilt axis

What is claimed is:

1. A method, comprising:
   a) disposing a movable object in a sample chamber;
   b) after a), using a beam of charged particles generated by a particle beam microscope to scan a volume of the sample chamber with the beam of charged particles;
   c) during b), using a detector to detect interaction signals caused by the interaction of the beam of charged particles and the volume of the sample chamber;
   d) during b) and c) moving the movable object in a direction toward the volume of the sample chamber;
   e) during d), monitoring the detected interaction signals and registering a change in the interaction signals; and
   f) based on the registered change in the interaction signals, stopping movement of the object.

2. The method of claim 1, further comprising, before b, defining the volume of the sample chamber.

3. The method of claim 1, further comprising repeating at least one of b) through e).

4. The method of claim 1, further comprising using a plurality of detectors to detect the interaction signals.

5. The method of claim 1, further comprising recording a visualization image.

6. The method of claim 1, further comprising using at least two volumes of the sample chamber during b) through e).

7. The method of claim 6, wherein:
   the at least two volumes of the sample chamber comprise first and second volumes of the sample chamber;
   the first volume of the sample chamber is defined such that movement of the object in a first movement toward the first volume of the sample chamber is detectable; and
   the second volume of the sample chamber is defined such that movement of the object in a second movement direction toward the second volume of the sample chamber is detectable.

8. The method of claim 7, wherein the first movement direction is orthogonal to the second movement direction.

9. The method of claim 6, wherein the at least two volumes of the sample chamber are configured to define a path in three-dimensional space, and the movable object is moved along the path.

10. The method of claim 6, further comprising simultaneously monitor the detectable signals in the at least two volumes of the sample chamber.

11. The method of claim 1, wherein:
the method further comprises monitoring a position of the movable object in the sample chamber based on the registered change in the interaction signals;
the particle beam microscope comprises a first particle beam column configured to produce a first particle beam having a first axis and a second particle beam column configured to produce a second particle beam having a second axis;
the first particle beam column has a first optical axis;
the second particle beam column has a second optical axis;
the first and second optical axes define a non-zero angle; and
the method comprising using the first particle beam and/or the second particle beam to scan the volume of the sample chamber.

12. The method of claim 1, wherein the volume of the sample chamber comprises at least two partial volumes of the sample chamber that disposed a distance from each other, and the method comprises evaluating together detection signals of the at least two partial volumes of the sample chamber.

13. The method of claim 1, further comprising using a plurality of volumes of the sample chamber disposed a distance from each other, and evaluating detection signals of the plurality of volumes of the sample chamber separately from one another.

14. The method of claim 1, wherein the movable object comprises a TEM lamella.

15. One or more machine-readable hardware storage devices comprising instructions that are executable by one or more processing devices to perform operations comprising the method of claim 1.

16. A system, comprising:
one or more processing devices; and
one or more machine-readable hardware storage devices comprising instructions that are executable by the one or more processing devices to perform operations comprising the method of claim 1.

17. The system of claim 16, further comprising a sample chamber, wherein the particle beam microscope, the barrier region and the movable object are disposed in the sample chamber.

18. The method of claim 1, further comprising monitoring a position of the movable object in the sample chamber based on the registered change in the interaction signals.

19. The method of claim 1, wherein:
the particle beam microscope comprises a first particle beam column configured to produce a first particle beam having a first axis and a second particle beam column configured to produce a second particle beam having a second axis;
the first particle beam column has a first optical axis;
the second particle beam column has a second optical axis;
the first and second optical axes define a non-zero angle; and
the method comprising using the first particle beam and/or the second particle beam to scan the volume of the sample chamber.

20. The method of claim 19, wherein the first particle beam comprises an electron beam, and the second particle beam comprises an ion beam.

* * * * *